United States Patent
Martinozzi et al.

(10) Patent No.: US 10,037,805 B2
(45) Date of Patent: Jul. 31, 2018

(54) METHOD AND CONTROLLER FOR PROGRAMMING NON-VOLATILE MEMORY

(71) Applicant: SK hynix Inc., Gyeonggi-do (KR)

(72) Inventors: Giulio Martinozzi, Agrate Brianza (IT); Min Sang Park, Chungcheongbuk-do (KR); Sang Jo Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 127 days.

(21) Appl. No.: 15/173,357

(22) Filed: Jun. 3, 2016

(65) Prior Publication Data

US 2016/0358658 A1  Dec. 8, 2016

(30) Foreign Application Priority Data

Jun. 5, 2015 (IT) .............................. 102015020953

(51) Int. Cl.
| | |
|---|---|
| *G11C 11/34* | (2006.01) |
| *G11C 16/10* | (2006.01) |
| *G06F 3/06* | (2006.01) |
| *G11C 11/56* | (2006.01) |
| *G11C 16/04* | (2006.01) |
| *G11C 16/32* | (2006.01) |

(52) U.S. Cl.
CPC ............ *G11C 16/10* (2013.01); *G06F 3/0604* (2013.01); *G06F 3/0632* (2013.01); *G06F 3/0679* (2013.01); *G11C 11/5628* (2013.01); *G11C 16/0483* (2013.01); *G11C 16/32* (2013.01)

(58) Field of Classification Search
CPC . G11C 16/10; G11C 16/0483; G11C 11/5628; G11C 16/32; G06F 3/0632; G06F 3/0604; G06F 3/0679
See application file for complete search history.

(56) References Cited

U.S. PATENT DOCUMENTS

| | | | |
|---|---|---|---|
| 2009/0168533 A1* | 7/2009 | Park .................... | G11C 5/02 365/185.17 |
| 2011/0267895 A1* | 11/2011 | Lee ..................... | G11C 11/5628 365/185.25 |
| 2012/0033501 A1* | 2/2012 | Park .................... | G11C 11/5642 365/185.19 |
| 2013/0044544 A1 | 2/2013 | Shiino et al. | |
| 2016/0055914 A1* | 2/2016 | Nam .................... | G11C 16/10 365/185.25 |

FOREIGN PATENT DOCUMENTS

WO   WO 2008/073892   6/2008

OTHER PUBLICATIONS

The Extended Search Report issued by the Italian Patents and Trademarks Office dated Feb. 9, 2016.

\* cited by examiner

*Primary Examiner* — Mohammed A Bashar
(74) *Attorney, Agent, or Firm* — IP & T Group LLP

(57) ABSTRACT

A method is provided for programming a non-volatile memory having a plurality of word lines, the method comprising: applying a pass voltage to a selected word line among the plurality of word lines; and applying one of first and second program voltages to the selected word line by increasing the pass voltage, wherein the applying of one of the first and second program voltages increases the pass voltage with a single increment.

17 Claims, 6 Drawing Sheets

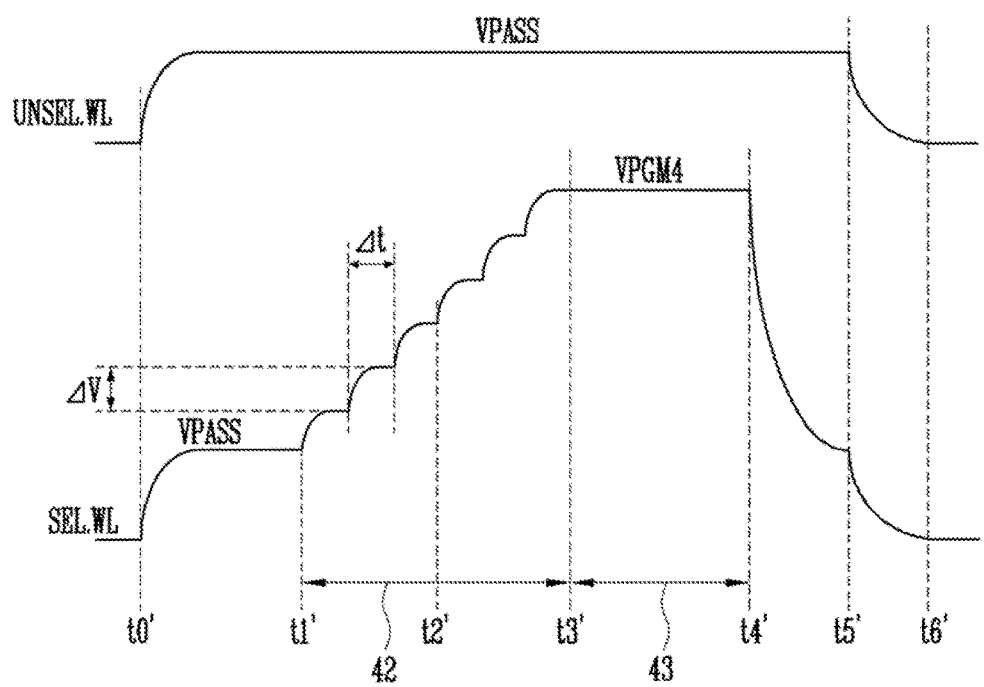

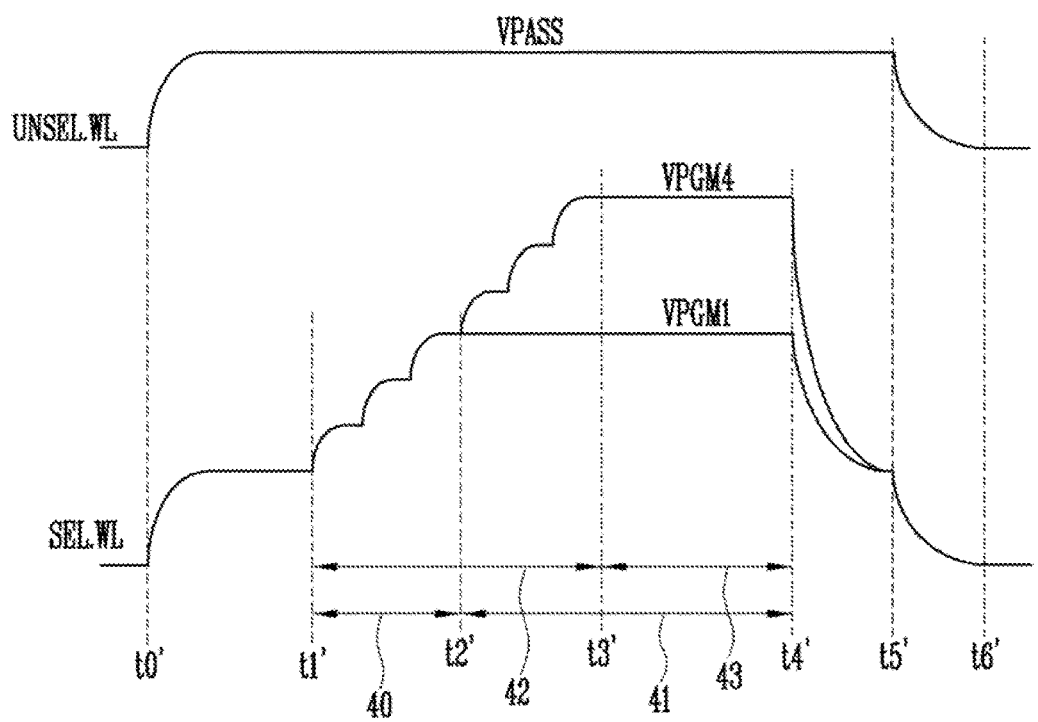
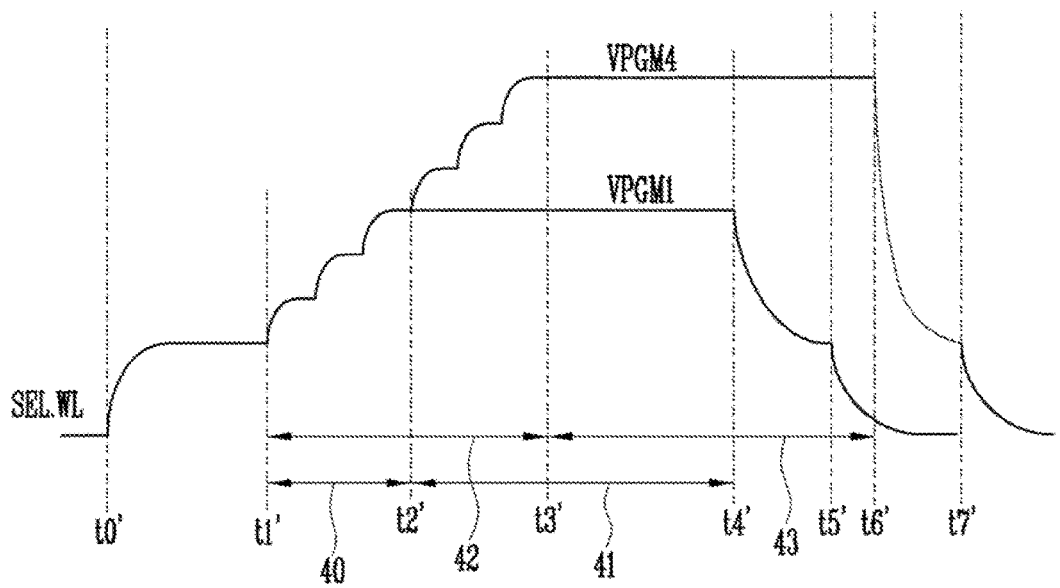

METHOD AND CONTROLLER FOR PROGRAMMING NON-VOLATILE MEMORY

CROSS-REFERENCE TO RELATED APPLICATION

The present application claims priority to Italian patent application No, 102015000020953 filed on Jun. 5, 2015, which is incorporated herein by reference in its entirety.

BACKGROUND

1. Field

The present disclosure relates to a method and controller for programming a non-volatile memory.

The disclosure particularly, but not exclusively, relates to a method and controller capable of controlling a slope of voltage driven to a selected word line of the non-volatile memory to be less steep.

2. Description of the Related Art

Among the various types of flash memory devices, NAND-type flash memory devices are increasingly used as a high capacity data storage media. Each cell of a flash memory is programmed to store information by trapping electrons in the floating gate of the cell. The programming operation is performed by driving a strong positive voltage on the control gate to force a current to flow from the channel through the floating gate to the control gate, a phenomenon known as the "Fowler Nordheim Tunnelling" effect. A control gate is connected to a word line of the flash memory, and a voltage is provided to the control gate through the word line. Each memory cell can store a single bit which is referred to as a single level memory cell (SLC) or alternatively, each cell can store multiple bits which is referred to as a multiple level memory cell (MLC). In both of the SLC and MLC, the information stored in each cell s defined by a corresponding threshold voltage of the memory cell.

SUMMARY

Embodiments of the invention are directed to a method and a controller for programming a non-volatile memory, capable of sophisticatedly controlling the slope of programming pulses and avoiding a program disturb effect by using a novel and simple scheme, when different programming voltages are required.

In an embodiment of the invention, a method is provided for programming a non-volatile memory having a plurality of word lines, the method comprising: applying a pass voltage to a selected word line among the plurality of word lines; and applying one of first and second program voltages to the selected word line by increasing the pass voltage, wherein the applying of one of the first and second program voltages increases the pass voltage with a single increment.

In an embodiment of the invention, a controller is provided for programming a non-volatile memory having a plurality of word lines, the controller comprising: a processor; and a DA converter operable under a control of the processor, and suitable for: applying a pass voltage to a selected word line among the plurality of word lines; and applying one of first and second program voltages to the selected word line by increasing the pass voltage, wherein the DA converter increases the pass voltage with a single increment.

The processor comprises: a microprocessor; and a dedicated logic block, wherein the DA converter is operable under a control of the dedicated logic block.

BRIEF DESCRIPTION OF THE DRAWINGS

The characteristics and advantages of the disclosure will be apparent from the following description of embodiments thereof given by way of indicative and non-limiting examples with reference to the annexed drawings, in which:

FIG. 1B is a timing diagram of programming operation employing a programming voltage of VPGM4 according to the embodiment.

FIG. 1C is a timing diagram showing the programming operations of FIGS. 1A and 1B together.

FIG. 1D is a timing diagram showing programming operations according to another embodiment.

DETAILED DESCRIPTION

Figure 1A:
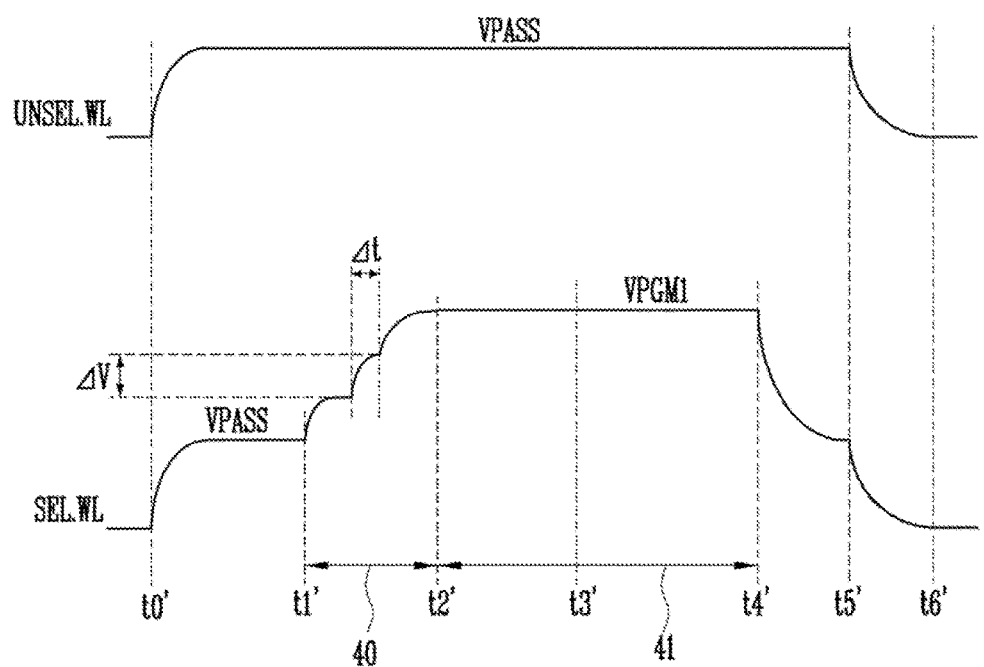
FIG. 1A is a timing diagram of a programming operation employing a programming voltage of VPGM1 according to an embodiment.

Exemplary embodiments of the present invention will be described in detail below with reference to the accompanying drawings. While the present invention is shown and described in connection with exemplary embodiments thereof, it aril be apparent to those skilled in the art that various modifications can be made without departing from the spirit and scope of the invention. The terms and words used in the specification and claims should not be construed according to their ordinary or dictionary meaning. In addition, detailed descriptions of constructions well known in the art may be omitted to avoid unnecessarily obscuring the gist of the present invention.

It will be also understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present disclosure.

It will be further understood that when an element is referred to as being "connected to", or "coupled to" another element, it can be directly on, connected to, or coupled to the other element, or one or more intervening elements may be present. In addition, it will also be understood that when an element is referred to as being "between" two elements, it can be the only element between the two elements, or one or more intervening elements may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise.

It will be further understood that the terms "comprises", "comprising", "includes", and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings Referring now to FIG. 1A a timing diagram of a programming operation which employs a programming voltage VPGM1 is provided, according to an embodiment of the present invention.

In FIG. 1A, a selected word line is a word line coupled to a control gate of a cell which undergoes a programming operation. An unselected word line is a word line not coupled to a control gate of a cell which undergoes a programming operation. The unselected word line may be coupled to cells of the same string or same block with the cell to be programmed.

From a time point t0' to a time point t1', a pass voltage VPASS is applied to the selected word-line SEL.WL while the same VPASS is applied to the unselected word lines UNSEL.WL. At time point t0', the voltages of unselected word lines are synchronized with the voltage of selected word line SEL.WL, but the embodiment is not limited thereto.

Then, at time point t1', the voltage driven to the selected word-line is gradually increased by a step value ΔV during a time step Δt. This step-wise increment is repeated until the voltage driven to the selected word line reaches a programming voltage VPGM1 at time point t2'. Then, the voltage applied to the selected word line is maintained as VPGM1 for a specific period, e.g. from time point t2' to time point t4'. From time point t0' to time point t5', the pass voltage VPASS may be driven to the unselected word lines UNSEL.WL, but the embodiment is not limited thereto.

The duration from t1' to t2' may be defined as a rising time 40, and the duration from t2' to t4' may be defined as a plateau time 41. The timing of the programming or a program time can be controlled so that the sum of the rising time 40 and the plateau time 41 may be constant regardless of the programming voltage VPGM1.

In FIG. 1A, it is shown that during the rising time 40, in each step increase of the voltage, the voltage rises to as much as a step value ΔV, then stays flat at the increased specific value for the remaining time of the time step Δt, and then transits to the next step. In other words, the slope of the voltage rise (or the rate of the voltage increase) is "0" for the remaining time of the time step Δt, in FIG. 1A. However, the time step Δt can also be designed in a way so that there is not any substantial period during which the voltage slope is zero, during each time step Δt during the rising time 40, because it is not necessary to introduce the flat status in each step. In other words, the step value ΔV and the time step Δt can be chosen so that the voltage may increase during the rising time 40 (period from t1' to t2') without having a severe fluctuation of its slope. Stated otherwise the voltage may be increased from an initial value of VPASS at time t1' to the program voltage value of VPGM1 at time t2' with a less severe fluctuation of its slope, i.e. its rate of increase.

FIG. 1B is a timing diagram of a programming operation employing a programming voltage of VPGM4 according to an embodiment. The programming voltage of VPGM4 is greater than the programming voltage of VPGM1 of FIG. 1A. The programming voltage can differ in each pulse of the ISPP scheme.

In FIG. 1B, from t0' to t1', a pass voltage VPASS is applied to the selected word line SEL.WL while the same VPASS is applied to the unselected word lines UNSEL.WL. At t0', the voltages of unselected word lines are synchronized with the voltage of selected word line SEL. WL, but the embodiment is not limited thereto.

Then, at t1', the voltage driven to the selected word line is gradually increased by a step value ΔV during a time step Δt. This step-wise increment is repeated until the voltage driven to the selected word line reaches a programming voltage VPGM4 at t3'. Then, the voltage applied to the selected word line is maintained as VPGM4 for a specific period, e.g., from t3' to t4'. From t0' to t5', the pass voltage VPASS is driven to the unselected word lines UNSEL.WL.

In FIG. 1B, the duration from t1' to t3' may be defined as a rising time 42, and the duration from t3' to t4' may be defined as a plateau time 43. The program time can be controlled so that the sum of the rising time 42 and the plateau time 43 may be constant regardless of the programming voltage VPGM.

FIG. 1C is a timing diagram showing the programming operations of FIGS. 1A and 1B together.

As shown in FIG. 1C, the slope of the driven voltage from the time point t1' to the time point t2' is regular regardless of the final values of the programming voltages VPGM1 and VPGM4. The rising times 40 and 42 may vary depending on the programming voltage values VPGM1 and VPGM4. For the programming voltage VPGM1, there are three steps during the rising time 40, while there are six steps during the rising time 42 for the programming voltage VPGM4, as shown in FIG. 1C. The plateau times 41 and 43 may also vary depending on the programming voltage values VPGM1 and VPGM4. Even though the rising times and/or the plateau times may vary, the sum of the rising time and the plateau time or the program time may be kept constant.

In the example of FIG. 1C, it is shown that there are three steps during the period from t1' to t2', during the rising time 40. However, the number of steps in FIG. 1C is just an example, and the number of the steps during the rising time 40 may vary based, for example, on the time step Δt, the step voltage ΔV, the pass voltage VPASS, and the programming voltage VPGM1. Thus, the embodiment is not limited to the number of steps during the rising time.

The step value ΔV and the time step Δt are independent of the programming voltages VPGM1 and VPGM4. That is to say, the step value ΔV and the time step Δt may be predetermined, and used for the different programming values VPGM1 and VPGM4.

The step value ΔV and the time step Δt may be constant during the rising times 40 and/or 42, but the embodiment is not limited thereto.

The plateau times 41 and 43 are greater than a predetermined minimum value in order to guarantee correct programming with the target programming voltages VPGM1 and VPGM4.

By using the programming method of the present invention the control of the slope of the voltage increase during the rising time may be simplified. Also, it may be possible to control the slope not to exceed a predetermined value.

The embodiment has been explained with the programming voltages VPGM1 and VPGM4, however, it is noted that the invention is not limited to any specific programming voltages. For example, more than two programming voltages of different programming voltage values may be used in the current scheme.

FIG. 1D is a timing diagram showing the programming operations according to another embodiment.

The timing diagram of FIG. 1D is identical to that of FIG. 1C except that the plateau time 41 of programming voltage VPGM1 is identical to the plateau time 43 of programming voltage VPGM4 and thus the sums of the rising time and the plateau time or the program time for the programming voltages of VPGM1 and VPGM4 are different from each other.

Therefore, the driven voltage starts to drop at t4' when the programming voltage of VPGM1 is applied, while the driven voltage starts to drop at t6' when the programming voltage of VPGM4 is applied. The timing when the driven voltage drops from the target programming voltages VPGM1 and VPGM4 may vary depending on the level of the target programming voltages VPGM1 and VPGM4.

Figure 2A:
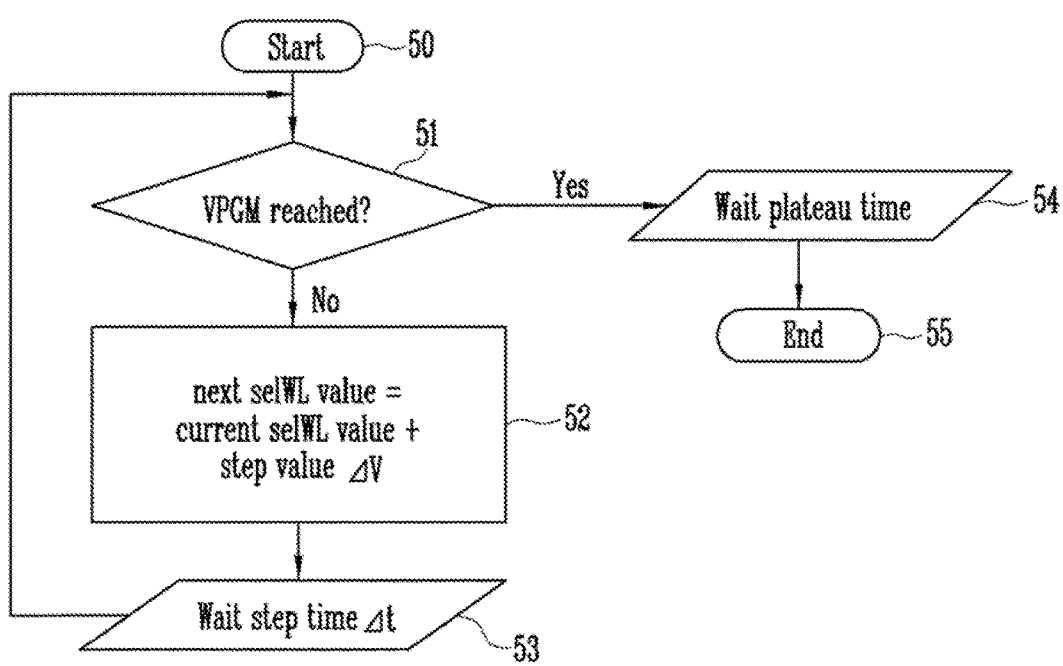
FIG. 2A is a flow chart of an exemplary process of the programming operation.
Figure 3A:
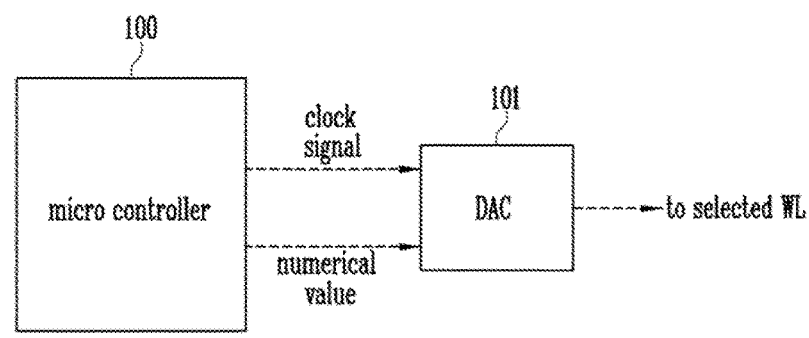
FIG. 3A schematically shows an exemplary circuit block diagram illustrating a controller suitable to generate the programming voltage according to an embodiment.
Figure 3B:
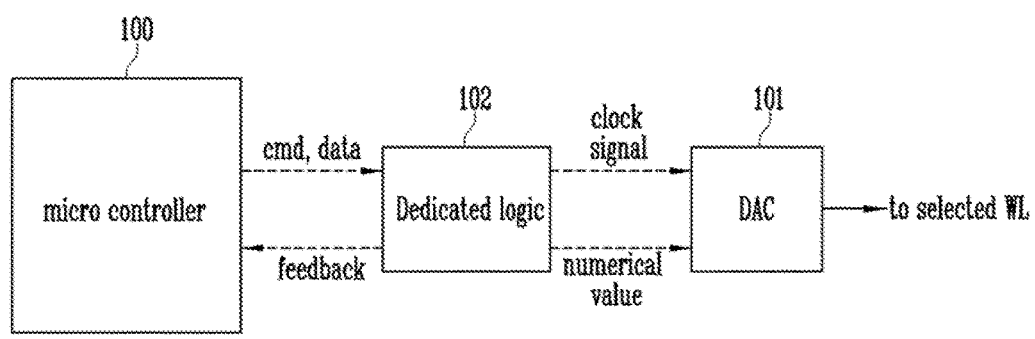
FIG. 3B schematically shows another exemplary circuit block diagram illustrating a controller suitable to generate the programming voltage according to the embodiment.

FIG. 2A is a flow chart of an exemplary process of the programming operation. The process of FIG. 2A can be implemented by a microcontroller 100 and a DA converter (DAC) 101 as shown in FIG. 3A, or can also be implemented by the microcontroller 100, a dedicated logic 102, and the DA converter (DAC) 101 as shown in FIG. 3B.

Once the programming voltage VPGM, the time step Δt, and the step value ΔV are determined, the method starts at step 50. At step 51, it is checked whether or not the voltage selWL for the selected word line SEL.WL has reached the programming voltage of VPGM. The voltage selWL for the selected word line SEL.WL is not a voltage directly driven to the selected word line SEL.WL, but is a digital value stored in a memory of the microprocessor 100 or in a register or the dedicated logic 102. The value selWL may be used as an input to the DAC converter 101 whose output voltage value (analogue value) is provided to the selected word line SEL.WL.

If the voltage selWL of the selected word line SEL.WL has not reached the programming voltage of VPGM, then the process transits to step 52. At step 52, the next voltage selWL for the selected word line SEL.WL is set at a value derived by the sum of the current voltage selWL for the selected word line SEL.WL and the step value ΔV. After setting the next voltage selWL for the selected word line SEL.WL, the process waits for the time step Δt to elapse at step 53. After the time step Δt elapses, the process transits to step 51 again, and checks whether the voltage selWL for the selected word line SEL.WL has reached the programming voltage of VPGM. The loop from step 51 to step 53 is repeated as many times as may be needed until the voltage for the selected word line selWL reaches the programming voltage VPGM.

When the voltage for the selected word line selWL reaches the programming voltage of VPGM, the process transits to step 54. At step 54, the process waits for the plateau time elapse. The plateau time may be defined as a constant time. Once the voltage for the selected word line selWL is set at the programming voltage value of VPGM it remains constant for the preset plateau time at step 54, and when the plateau time elapses, then the process terminates at step 55.

In particular, it should be remarked that the waveform of FIG. 1D shows the process of FIG. 2A. More particularly, according to this process shown in FIGS. 1D and 2A, the loop of steps 51, 52 and 53 is performed for each of the rising time 42 for the programming voltage of VPGM4 and the rising time 40 for VPGM1; afterwards, then the process waits for each of the plateau time 43 for the programming voltage of VPGM4 and the plateau time 41 for the programming voltage of VPGM1 during the step 54. The sums of the rising time and the plateau time or the program time for the programming voltages of VPGM1 and VPGM4 are different from each other.

In this way, the process of FIG. 2A always provides for fixed plateaus 41 and 43 for the programming voltages of VPGM1 and VPGM4, respectively, and hence a variable programming time; in particular, the programming time would be longer for higher programming voltage of VPGM.

Figure 2B:
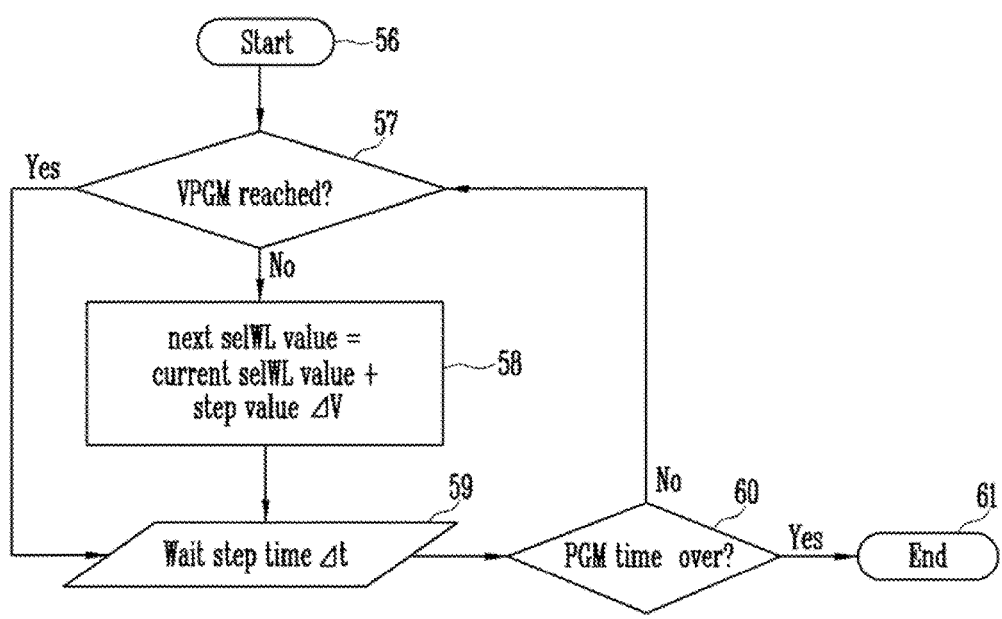
FIG. 2B is a flow chart of another exemplary process of the programming operation.

FIG. 2B is a flow chart showing another exemplary process of the programming operation. The process of FIG. 2B may be implemented by the microcontroller 100 and the DAC 101 as shown in FIG. 3A, or can also be implemented by the microcontroller 100, the dedicated logic 102, and the DAC 101 as shown in FIG. 3B.

Once the programming voltage VPGM, the time step Δt, and the step value ΔV are determined, the method starts at step 56. At step 57, it is checked whether or not the voltage selWL for the selected word line SEL.WL has reached the value of the programming voltage VPGM. The voltage selWL for the selected word line SEL.WL is not a voltage directly driven to the selected word line SEL.WL, but is a digital value stored in a memory of the microprocessor 100 or in a register or the dedicated logic 102. The value selWL can be used as an input to the DAC converter 101 whose output voltage value (analogue value) is provided to the selected word line SEL.WL.

If the voltage selWL of the selected word line SEL.WL has not reached the programming voltage of VPGM, then the process transits to step 58. At the step 58, the next voltage selWL for the selected word line SEL.WL value is set at a value derived by the sum of the current voltage selWL for the selected word line SEL.WL and the step value ΔV. After setting the next voltage selWL for the selected word line SEL.WL, the process waits for the time step Δt to elapse at step 59.

After the time step Δt elapses, the process transits to step 60, and determines whether a program time is over or not. The program time may be defined as a total constant programming time, e.g. the sum of the rising time and the plateau time.

If the program time is not over, the process transits to step 57 and determines whether the voltage selWL for the selected word line SEL.WL has reached the programming voltage of VPGM or not. So, until the voltage selWL for the selected word line SEL.WL reaches the programming voltage of VPGM, the process of the loops formed by the steps 57, 58, 59 and 60 is repeated.

Once the voltage selWL for the selected word line SEL.WL reaches the programming voltage of VPGM, the process transits from step 57 to step 59 without increasing the voltage selWL for the selected word line SEL.WL.

Then, unless the PGM time is over, the process transits from step 60 to step 57. So, the process of the loops formed by the steps 57, 59, and 60, is repeated and an input to the DAC 101 is set as the programming voltage of VPGM constantly. When the program time expires, the loop of steps 57, 59, and 60 terminates, and the process transits to step 61.

In particular, it should be remarked that the waveform of FIG. 1C shows the process of FIG. 2B. More particularly, according to this process, the program time (i.e., the sum of the rising time and the plateau time) is fixed.

As already indicated, the process of FIGS. 1C and 2B, waits until the desired programming voltage VPGM is reached and/or the plateau time has consumed the remaining time of the total program time. The plateau time may be different for different programming voltages VPGMs.

In particular, as shown in FIGS. 1C and 2B, according to this process, the loop of steps 57, 58, 59 and 60 is repeated (answer NO to the questions of step 57 and 60) during the rising time 42 for the programming voltage of VPGM4. Similarly, the loop of steps 57, 59 and 60 is repeated (answer YES to the question of step 57 and answer NO to the question of step 60) during the plateau time 43 for the programming voltage of VPGM4 till the end of the program time. In this sense, the process of FIG. 2B also comprises a counter for the program time, in parallel to the shown flow chart, ending with the answer YES to the question of step 60.

FIG. 3A schematically shows an exemplary circuit block diagram illustrating a controller suitable to generate the programming voltage VPGM according to an embodiment of the invention.

The controller comprises microcontroller 100 and DAC 101. The microcontroller 100 may output a clock signal and a numerical value to the DAC 101. The numerical value may be a digital value consisting of several bits. The output value of the DAC 101, i.e., an analog value, is determined according to the numerical value inputted to the DAC 101. The clock signal can synchronize the operation of the DAC 101. In other words, the DAC 101 may read the numerical value at a rising edge or a falling edge of the clock signal or when the clock signal has a logic low or high value, depending on the specific implementation of the DAC 101.

The clock signal provided to the DAC 101 may be configured so that the numerical value is read by DAC 101 at every time step $\Delta t$.

The microcontroller 100 carries out the process illustrated in FIGS. 2A and 2B by controlling the output to the DAC 101, e.g., the numerical value and the clock signal. The numerical value provided to DAC 101 corresponds to the voltage selWL for the selected word line SEL.WL of FIGS. 2A and 2B.

The microcontroller 100 may store the voltage selWL for the selected word line SEL.WL in its own register or cache memory, and update them as shown in steps 52 and 58 of FIGS. 2A and 2B. Alternatively, the microcontroller 100 may store the voltage selWL for the selected word line SEL.WL in a memory located out of the microprocessor and it may update them as shown in steps 52 and 58 of FIGS. 2A and 2B.

FIG. 3B schematically shows another exemplary circuit block diagram illustrating a controller suitable to generate the programming voltage according to an embodiment of the invention.

The controller comprises the microcontroller 100, the dedicated logic block 102 and the DA converter or DAC 101. The dedicated logic block 102 may output a clock signal and a numerical value to the DAC 101. The numerical value is a digital value consisting of several bits. The output value of the DAC 101, i.e. an analog value, is determined according to the numerical value inputted to the DAC 101. The clock signal can synchronize the operation of the DAC 101. In other words, the DAC 101 may read the numerical value at a rising edge or a falling edge of the clock signal or when the clock signal has a logic low or high value, depending on the specific implementation of the DAC 101.

The clock signal provided to the DAC 101 may be configured so that the numerical value is read by DAC 101 at every time step $\Delta t$.

The microcontroller 100 may provide a command and data to the dedicated logic block 102.

The dedicated logic block 102 carries out the process illustrated in FIGS. 2A and 2B by controlling the output to the DAC 101, e.g., the numerical value and the clock signal. The numerical value provided to DAC 101 corresponds to the voltage selWL for the selected word line SEL.WL of FIGS. 2A and 2B.

The dedicated logic block 102 may store the voltage selWL for the selected word line SEL.WL in its own register, and it may update them as shown in steps 52 and 58 of FIGS. 2A and 2B. Alternatively, the dedicated logic block 102 may store the voltage selWL for the selected word line SEL.WL in a memory located out of the dedicated logic block 102, and it may update them as shown in steps 52 and 58 of FIGS. 2A and 2B.

The dedicated logic block 102 can be made by a finite state machine (FSM) that may be initialized with start value, stop value, the program time, step value $\Delta V$, and time step $\Delta t$ by the microcontroller 100 through the command and data signals. The start value can be the pass voltage VPASS. The stop value, or final value may be the programming value of VPGM1 or VPGM4. The program time may be the sum of the rising time 40 and the plateau time 41 or the sum of the rising time 42 and the plateau time 43 as defined in FIGS. 1A and 1B.

The dedicated logic block 102 may send feedback to the microcontroller 100, for example, when the programming operation with the inputted program voltage is terminated. That is to say, the dedicated logic block 102 may control the DAC 101 asynchronously with the microcontroller 100.

The microcontroller 100 may initialize, through the command and data signals, the dedicated logic block 102 for a next programming operation before the current programming operation is terminated. The microcontroller 100 may send a start instruction to the dedicated logic block 102 through the command signal.

With the aforementioned method for programming a cell of a non-volatile memory, control for the slope of increase of the voltage driven to a selected word line of the non-volatile memory can be facilitated. Moreover, the slope of increase of the voltage can be controlled to be less steep so that a program disturbance may be avoided.

From the foregoing it will be appreciated that, although specific embodiments of the invention have been described herein for purposes of illustration, various modifications may be made without deviating from the spirit and/or scope of the invention. Accordingly, the invention is not limited except as by the appended claims.

What is claimed is:

1. A method for programming a non-volatile memory having a plurality of word lines, the method comprising:
applying a pass voltage to a selected word line among the plurality of word lines; and applying one of first and second program voltages to the selected word line by increasing the pass voltage, wherein the applying of one of the first and second program voltages increases the pass voltage with a single increment, and wherein a voltage level of the first program voltage and a voltage level of the second program voltage are different from each other, and a voltage slope at which the pass voltage is increased up to the first program voltage is the same as a voltage slope at which the pass voltage is increased up to the second program voltage.

2. The method of claim 1, wherein the applying of the first program voltage includes:
  increasing the pass voltage to the first program voltage during a first rising time; and
  keeping the first program voltage during a first plateau time.

3. The method of claim 2, wherein the applying of the second program voltage includes:
  increasing the pass voltage to the second program voltage during a second rising time; and
  keeping the second program voltage during a second plateau time.

4. The method of claim 3, wherein the first rising time and the second rising time are different from each other.

5. The method of claim 3, wherein the first plateau time and the second plateau time are different from each other.

6. The method of claim 3, wherein the applying of one of the first and second program voltages repeatedly increases the pass voltage by a single step voltage during corresponding one of the first and second rising times.

7. The method of claim 6, wherein a number of application times of the step voltage during the first rising time is different from a number of application times of the step voltage during the second rising time.

8. A controller for programming a non-volatile memory having a plurality of word lines, the controller comprising:
  a processor; and
  a DA converter operable under a control of the processor, and suitable for:
  applying a pass voltage to a selected word line among the plurality of word lines; and
  applying one of first and second program voltages to the selected word line by increasing the pass voltage, wherein the DA converter increases the pass voltage with a single increment, and wherein a voltage level of the first program voltage and a voltage level of the second program voltage are different from each other, and a voltage slope at which the pass voltage is increased up to the first program voltage is the same as a voltage slope at which the pass voltage is increased up to the second program voltage.

9. The controller of claim 8, wherein the DA converter increases the pass voltage to the first program voltage during a first rising time, and keeps the first program voltage during a first plateau time.

10. The controller of claim 9, wherein the DA converter increases the pass voltage to the second program voltage during a second rising time, and keeps the second program voltage during a second plateau time.

11. The controller of claim 10, wherein the first rising time and the second rising time are different from each other.

12. The controller of claim 10, wherein the first plateau time and the second plateau time are different from each other.

13. The controller of claim 10, wherein the DA converter repeatedly increases the pass voltage by a single step voltage during corresponding one of the first and second rising times.

14. The controller of claim 13, wherein the DA converter repeatedly increases the pass voltage by a single step voltage so that a number of application times of the step voltage during the first rising time is different from a number of application times of the step voltage during the second rising time.

15. The controller of claim 8, wherein the processor comprises:
  a microprocessor; and
  a dedicated logic block,
  wherein the DA converter is operable under a control of the dedicated logic block.

16. The controller of claim 15, wherein the dedicated logic block controls the DA converter asynchronously with the microprocessor.

17. The controller of claim 15, wherein the microprocessor initializes the dedicated logic block for a next programming operation before the current programming operation is terminated.

* * * * *

UNITED STATES PATENT AND TRADEMARK OFFICE
CERTIFICATE OF CORRECTION

PATENT NO. : 10,037,805 B2  
APPLICATION NO. : 15/173357  
DATED : July 31, 2018  
INVENTOR(S) : Giulio Martinozzi et al.

Page 1 of 1

It is certified that error appears in the above-identified patent and that said Letters Patent is hereby corrected as shown below:

On the Title Page

Change the Foreign Application Priority Data section as follows:  
(30) Foreign Application Priority Data  
Jun. 5, 2015 (IT)............................ 102015000020953

Signed and Sealed this
Eleventh Day of September, 2018

Andrei Iancu
*Director of the United States Patent and Trademark Office*